(12) United States Patent
Rajala et al.

(10) Patent No.: US 8,758,851 B2
(45) Date of Patent: Jun. 24, 2014

(54) METHOD FOR INCREASING THE DURABILITY OF GLASS

(75) Inventors: Markku Rajala, Vantaa (FI); Matti Putkonen, Espoo (FI)

(73) Assignee: Beneq Oy, Vantaa (FI)

( * ) Notice: Subject to any disclaimer, the term of this patent is extended or adjusted under 35 U.S.C. 154(b) by 479 days.

(21) Appl. No.: 12/746,107

(22) PCT Filed: Dec. 1, 2008

(86) PCT No.: PCT/FI2008/050701
§ 371 (c)(1),
(2), (4) Date: Sep. 22, 2010

(87) PCT Pub. No.: WO2009/071741
PCT Pub. Date: Jun. 11, 2009

(65) Prior Publication Data
US 2011/0111175 A1 May 12, 2011

(30) Foreign Application Priority Data

Dec. 3, 2007 (FI) .................................... 20070932

(51) Int. Cl.
*C23C 16/40* (2006.01)
*B05D 5/06* (2006.01)

(52) U.S. Cl.
USPC ....... 427/165; 427/166; 427/167; 427/255.31

(58) Field of Classification Search
USPC ........ 427/164, 165, 166, 167, 255.31; 117/84
See application file for complete search history.

(56) References Cited

U.S. PATENT DOCUMENTS

| | | | |
|---|---|---|---|
| 5,162,136 A | 11/1992 | Blum et al. | |
| 6,824,816 B2 * | 11/2004 | Aaltonen et al. | 427/124 |
| 6,974,779 B2 * | 12/2005 | O'Meara et al. | 438/769 |
| 2002/0093906 A1 * | 7/2002 | Deno et al. | 369/275.1 |
| 2002/0135099 A1 * | 9/2002 | Robinson et al. | 264/236 |
| 2003/0020210 A1 * | 1/2003 | Robinson et al. | 264/236 |
| 2003/0021997 A1 | 1/2003 | Veerasamy et al. | |
| 2004/0071960 A1 | 4/2004 | Weber et al. | |
| 2004/0208994 A1 | 10/2004 | Harkonen et al. | |
| 2005/0012975 A1 | 1/2005 | George et al. | |
| 2006/0063006 A1 * | 3/2006 | Naitou et al. | 428/410 |
| 2006/0068229 A1 * | 3/2006 | Hara et al. | 428/833.1 |
| 2006/0093833 A1 | 5/2006 | Meyer et al. | |

(Continued)

FOREIGN PATENT DOCUMENTS

EP 0 367 269 A2 5/1990
GB 1 223 775 3/1971

(Continued)

OTHER PUBLICATIONS

Kukil, Kaupo, et al., "Atomic Layer Deposition of Hafnium Dioxide Films from Hafnium Tetrakis(ethylmethylamide) and Water". Chemical Vapor Deposition, 2002, 8. No. 5, pp. 199.*

(Continued)

*Primary Examiner* — Bret Chen
(74) *Attorney, Agent, or Firm* — Merchant & Gould P.C.

(57) ABSTRACT

A method for increasing the durability of glass by a coating, according to the present invention comprises the step of coating glass with a coating comprising at least one layer whose thickness is below 5 nanometers, wherein the coating comprises a compound of at least one element.

10 Claims, 2 Drawing Sheets

(56) References Cited

U.S. PATENT DOCUMENTS

Figure 1A:
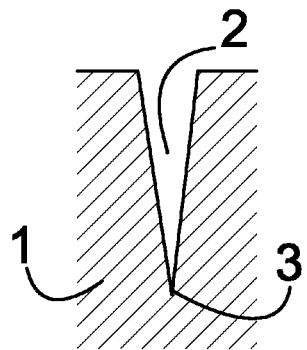
Figure 1A:
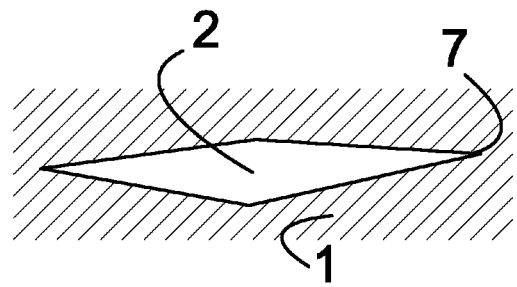
Figure 1B:
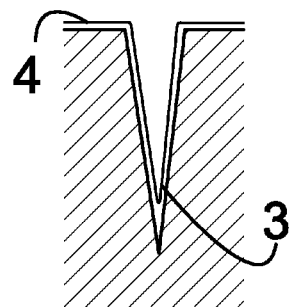
Figure 1B:
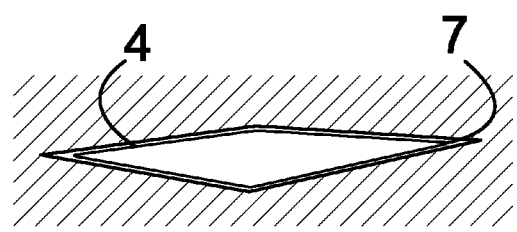
Figure 1C:
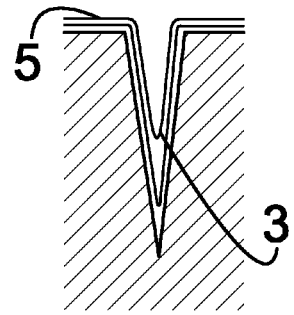
Figure 1C:
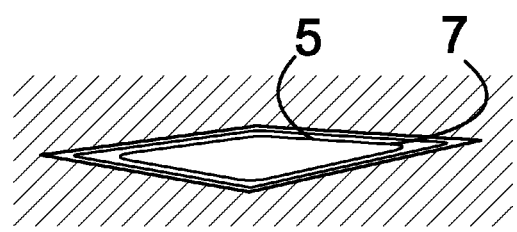

| | | | | |
|---|---|---|---|---|
| 2006/0275926 | A1* | 12/2006 | Carcia et al. | 438/1 |
| 2007/0234949 | A1* | 10/2007 | Ahn et al. | 117/949 |
| 2008/0044722 | A1* | 2/2008 | Mohamadinejad et al. | 429/44 |
| 2008/0075857 | A1* | 3/2008 | Chen et al. | 427/255.19 |
| 2010/0240531 | A1* | 9/2010 | Neubert et al. | 502/350 |

FOREIGN PATENT DOCUMENTS

| | | | |
|---|---|---|---|
| JP | 59-207856 A | | 11/1984 |
| JP | 2000-344544 A | | 12/2000 |
| JP | 2007-73879 | * | 3/2007 |
| WO | WO 88/09776 A1 | | 12/1988 |

OTHER PUBLICATIONS

Leskela, M., et al., "Atomic Layer Epitaxy in Deposition of Various Oxide and Nitride Thin Films". Journal de Physique IV, Colloque C5, supplement au Journal de Physique II, vol. 5, Jun. 1995, C5-937 to C5-951.*

Chen, J., et al., "Multi-cycling nanoidentation study on thin optical coatings on glass." J. Phys. D: Appl. Phys. 41 (2008) 074009, pp. 1-9.*

Bansal, N. P. et al. "Handbook of Glass Properties", Academic Press, Orlando, 1986, pp. 14-15, 223-226.

Kirkpatrick, R. et al. "Performance and durability of octadecyltrichlorosilane coated borosilicate glass", Journal of Non-Crystalline Solids, vol. 353, Aug. 2007, pp. 2624-2637.

Gao, S. et al. "Nanostructured coatings of glass fibers: Improvement of alkali resistance and mechanical properties", Acta Materialia, vol. 55, Jan. 2007, pp. 1043-1052.

Carturan, G. et al. "Strengthening of soda-lime-silica glass by surface treatment with sol-gel silica", Journal of Non-Crystalline Solids, vol. 353, 2007, pp. 1540-1545.

International Search Report for corresponding International Patent Application PCT/FI2008/050701, mailed Mar. 26, 2009.

Eurasian Office Action for corresponding Eurasian Patent Application No. 201000927/31 mailed Dec. 4, 2012.

"Strength", Big Soviet Encyclopedia, 1969-1978, http://dic.academic.ru.

* cited by examiner

METHOD FOR INCREASING THE DURABILITY OF GLASS

This application is a National Stage Application of PCT/FI2008/050701, filed 1 Dec. 2008, which claims benefit of Serial No. 20070932, filed 3 Dec. 2007 in Finland and which applications are incorporated herein by reference. To the extent appropriate, a claim of priority is made to each of the above disclosed applications.

FIELD OF THE INVENTION

The present invention relates to coating technology. Especially the present invention relates to a glass product and to a method for increasing the durability of a glass product.

DESCRIPTION OF THE PRIOR ART

A factor significantly affecting the properties of a glass product is the thickness of the glass in the product. In order for a glass product to be economical or practical it is often essential that the product be as light as possible, i.e. the thickness of a glass wall in a product should be as thin as possible. The demand for thin planar glass is increasing e.g. in the production of displays, solar cells and other corresponding products. Therefore there exists a need for methods for increasing the durability of glass, especially the durability of thin glass products.

Small scratches on the surface of a glass may significantly harm the properties of the glass in an attempt to fabricate glasses with high durability. These small scratches degrade the durability of the glass, because the stress at the tip of a scratch may exceed a level above which a crack rapidly propagates through the glass product, starting from the tip of the scratch. The stress at the tip of the scratch (i.e the crack) increases as the radius of curvature of the tip decreases (i.e. the scratch becomes sharper). The stress also increases as the depth of the scratch increases. The depth in this case is defined as the depth of the scratch in the direction perpendicular to the glass surface.

The maximum allowable stress at the tip of a scratch can be estimated using the formula $$\sigma_a = \sqrt{\frac{2E\gamma_s}{\pi a}\left(\frac{\pi\rho}{8a_0}\right)}, \quad (1)$$

where
$\sigma_a$ is the applied stress for fracture
E is modulus of elasticity
$\gamma_s$ is specific surface energy
a is one-half crack length, and $$\rho = \frac{b^2}{a},$$

where b equals half minor axis for an elliptical hole, and thus $\rho$ is the radius of curvature of the crack tip.

When the stress at the tip of a scratch exceeds the value $\sigma_a$ of equation (1) the glass fractures.

A thin glass product breaks easily. Hence increasing the durability of a glass product is a significant technological and economical challenge. Traditionally the durability of a planar glass has been increased by thermal tempering, i.e. by heating the glass to a temperature of about 650° C. and cooling the glass quickly down so that the surface of the glass becomes compressively stressed. This method is however not suitable for a thin glass with a thickness of below about 2-3 mm.

The durability of a thin glass has been increased by a method disclosed in patent publication GB1223775 (Nippon Sheet Glass Co., Ltd., publication date Mar. 3, 1971). In this method the glass is immersed in molten potassium nitrate, and the surface of the glass becomes compressively stressed due to a sodium/ion-exchange reaction between the glass comprising sodium and the potassium in the potassium nitrate bath. The method reduces the stress directed to the scratch but does not increase the radius of curvature at the tip of the scratch nor does it reduce the depth or the length of the scratch. The method is not suitable for increasing the durability of glass not comprising sodium, such as quartz glass.

Patent application publication PCT/EP88/00519 (Fraunhofer-Gesellschaft zur Förderung der angewandten Forschung E. V., publication date Dec. 15, 1988) discloses a method for increasing the durability of a glass product by coating the glass by the sol-gelmethod. The coating comprises at least one of the elements selected from a group of Si, Al, Ti and Zr. This kind of sol-gel-coating puts the surface of the glass under compressive stress, but the liquid phase precursors utilized in the method are not able to penetrate small scratches on the surface of the glass. Therefore small and possibly deep scratches with a small radius of curvature at their tip remain virtually uncoated under the sol-gel-coating, which only forms a cap over the scratch.

Patent application publication US2006/0093833 A1 (Dirk Meyer et al., publication date May 4, 2006) discloses a component fabricated out of quartz glass with increased durability. The increase of durability is based on a crystalline aluminum silicate coating, which forms a partially fused layer with the glass. This fused layer has either a concentration or a structural gradient. The fabrication of the component requires annealing to form the fused layer between the coating and the glass. Although not disclosed in the publication, the depth, the length and the radius of curvature of the tips of some scratches on the glass may possibly change as a result of the annealing. Annealing may nevertheless alter and degrade the optical properties of the glass and is therefore not a preferred method for increasing the durability of glass. The increase in the durability of glass reported in the aforementioned publication is primarily caused by the smaller coefficient of thermal expansion of the crystalline coating.

For a person skilled in the art it is known that the durability of glass may be increased by performing a fire polish, in which the glass product is heated with a gas burner. The heat absorbed from the flame of the gas burner on the surface of the glass causes softening of the glass, which may cause small scratches on the surface of the glass to become smaller or to close up. Fire polishing may however easily lead to degradation of the optical quality of the glass, especially for the case of thin glass, such as the one used in e.g. displays.

Softening temperature of a glass is the temperature at which the logarithm (radix number 10) of dynamic viscosity of the glass is 13.4. The softening temperature for soda lime glass is in the range of 480-550° C., for borosilicate glass in the range of 530-600° C., for aluminum silicate glass in the range of 700-800° C., and for quartz glass in the range of 1100-1200° C. (N. P. Bansal and R. H. Doremus, Handbook of Glass Properties, (1986) Academic Press, Inc. Orlando, pp. 14-15 and 223-226). At and below the softening temperature the structure of the glass is "locked into" the glass and does not change, unlike in higher temperatures. In order to fix (remove) a scratch in glass material, such as in the fire polishing technique, a temperature significantly exceeding the softening temperature is required.

A problem associated with the prior-art-methods for increasing the durability of glass is that these methods are not able to decrease the depth or the length of small scratches, or to increase the radius curvature of the tip of these scratches, without compromising the optical quality of the glass. Prior art does not disclose a method in which the increase of the durability of glass is based on increasing the radius of curvature at the tip of a scratch, or on decreasing the depth or the length of a scratch at a temperature lower than the softening temperature of the glass.

PURPOSE OF THE INVENTION

The purpose of the present invention is to reduce the aforementioned technical problems of the prior-art by providing a new type of glass product with increased durability and a method for increasing the durability of a glass product.

SUMMARY OF THE INVENTION

A method for increasing the durability of glass by a coating, according to the present invention comprises the step of coating glass with a coating comprising at least one layer whose thickness is below 5 nanometers (nm), wherein the coating comprises a compound of at least one element.

A glass product comprising a coating, according to the present invention comprises surface scratches with a width at the level of the glass surface of below 300 nanometers, the coating residing essentially conformally on the inside of the surface scratches to increase the durability of the glass.

A glass product comprising a coating, according to the present invention is fabricated by coating glass with a coating comprising at least one layer whose thickness is below 5 nanometers, wherein the coating comprises a compound of at least one element, to increase the durability of the glass.

The method of the present invention is used for increasing the durability of glass.

When glass is coated with a method according to the present invention the material of the thin layer (or layers) with a thickness of below 5 nm, utilized to make the coating, may essentially conformally penetrate in onto the sharp tips of scratches on the surface of the glass. This may result in a decrease of the depth and the length of the scratch and may additionally cause an increase in the radius of curvature at a tip, i.e. an endpoint, of the scratch. These factors may possibly contribute to the surprising measured increase in the durability of the glass. Prior-art methods, in contrast, do not employ thin layers with a thickness of below 5 nm. Due e.g. to the thickness of the layers associated with the methods of the prior art, material is not able to penetrate in onto the sharp tips of surface scratches. In this context a layer should be understood as meaning a deposit having the smallest thickness achievable with a given coating method and with a given set of process parameters.

A product according to the present invention possesses an increased flexural strength compared to a corresponding uncoated product. The increase in the flexural strength may result from the coating residing essentially conformally on the inside of small surface scratches.

According to one embodiment of the present invention, coating glass comprises coating the glass by alternately exposing the glass to at least two precursors, one precursor at a time, to form the coating by alternately repeating surface reactions between the surface of the glass substrate and a precursor.

According to one embodiment of the present invention, coating glass comprises coating the glass by alternately repeating essentially self-limiting surface reactions, to coat the glass by thin layers having a thickness of below 5 nanometers by atomic layer deposition.

According to one embodiment of the method of the present invention, coating glass comprises coating essentially conformally small scratches on the surface of the glass. The size of these small surface scratches may be defined by e.g. their width at the level of the glass surface. This width can be in one embodiment of the method of the invention below 300 nanometers, and in another embodiment of the invention below 100 nanometers.

According to one embodiment of the present invention, the glass product is fabricated by coating the glass by alternately exposing the glass to at least two precursors, one precursor at a time, to form the coating by alternately repeating, essentially self-limiting, surface reactions between the surface of the glass substrate and a precursor, to coat the glass by thin layers having a thickness of below 5 nanometers by atomic layer deposition.

When the glass is coated using an atomic layer deposition (ALD)-type process in which the substrate, i.e. the glass (more precisely, the surface of the glass substrate), is alternately exposed to precursors whose molecules adsorb on the surface of the substrate by essentially self-limiting surface reactions, excellent conformality of the coating can be achieved. An ALD-process enables the deposition of coatings in a layer-by-layer fashion. One layer in an ALD-process is deposited during one ALD-cycle. The meaning of the term ALD-cycle is clear for a person skilled in the art, and the term should be understood as meaning the shortest repeating pulsing (alternating exposure) sequence of precursors used in an ALD process. Depending on the particular ALD process, the thickness of one layer may range from below one Angstrom to a few nanometers. In addition to the small thickness of individual layers, the growth mechanism of a coating in an ALD process is governed by surface reactions. This further improves the conformality and penetration of the ALD coating material in onto smaller and sharper tips of surface scratches, compared to coating techniques employed in the prior art, which further strengthens the glass.

According to one embodiment of the present invention, coating glass comprises coating the glass at a temperature below the softening temperature of the glass. By using a temperature below the softening temperature of the glass for coating, the detrimental effects possibly caused by glass softening may be avoided. These effects may include degradation of optical quality and degradation of mechanical properties such as durability.

According to one embodiment of the present invention, coating glass comprises coating the glass with a coating having a total thickness of below 1000 nanometers. According to another embodiment of the present invention, coating glass comprises coating the glass with a coating having a total thickness of below 100 nanometers. By using a relatively thin coating on the glass the optical properties such as absorption or colour variation may be kept relatively unchanged compared to corresponding glass without coating.

According to one embodiment of the present invention, coating glass comprises coating the glass with a coating comprising oxide of at least one element.

According to another embodiment of the present invention, coating glass comprises coating the glass with a coating comprising oxide of an element selected from the group of aluminium, zirconium, zinc, silicon and titanium.

According to another embodiment of the present invention, coating glass comprises coating the glass with a coating comprising nitride of at least one element.

According to yet another embodiment of the present invention, coating glass comprises coating the glass with a coating comprising nitride of an element selected from the group of boron, silicon and aluminium.

According to one embodiment of the present invention, the coating comprises oxide of at least one element.

According to another embodiment of the present invention, the coating comprises nitride of at least one element.

Oxide and nitride materials are well suited for e.g. ALD-deposition. Furthermore the optical quality of oxides and nitrides of the aforementioned embodiments of the invention are good so as to not compromise the overall appearance of the underlying glass by e.g. strong absorption or colour variation.

According to one embodiment of the present invention, coating glass comprises coating glass having a thickness of below 3 millimeters. As the intrinsic durability, e.g. the flexural strength, of glass is proportional to the thickness of the glass, the relative effect that a method according to the present invention has on the durability of thin glass may be larger than for thick glass.

A glass product according to one embodiment of the present invention comprises surface scratches with a width at the level of the glass surface of below 100 nanometers, the coating residing essentially conformally on the inside of the surface scratches to increase the durability of the glass.

According to another embodiment of the present invention, the coating increases the radius of curvature at the tip of a surface scratch.

In addition to increasing the durability of glass possibly through an increase in the radius of curvature at the tips of small scratches and possibly through a decrease in the depth and the length of these scratches, it is possible that the coating also increases the durability of glass through chemical bonding with the glass.

The embodiments of the invention described hereinbefore may be used in any combination with each other. Several of the embodiments may be combined together to form a further embodiment of the invention. A method, a product or a use, to which the invention is related, may comprise at least one of the embodiments of the invention described hereinbefore.

DETAILED DESCRIPTION OF THE INVENTION

In the following, the present invention will be described in more detail with exemplary embodiments by referring to the accompanying figures, in which FIGS. 1a to 1d schematically illustrate cross sections of products according to certain embodiments of the present invention.

Figure 2:
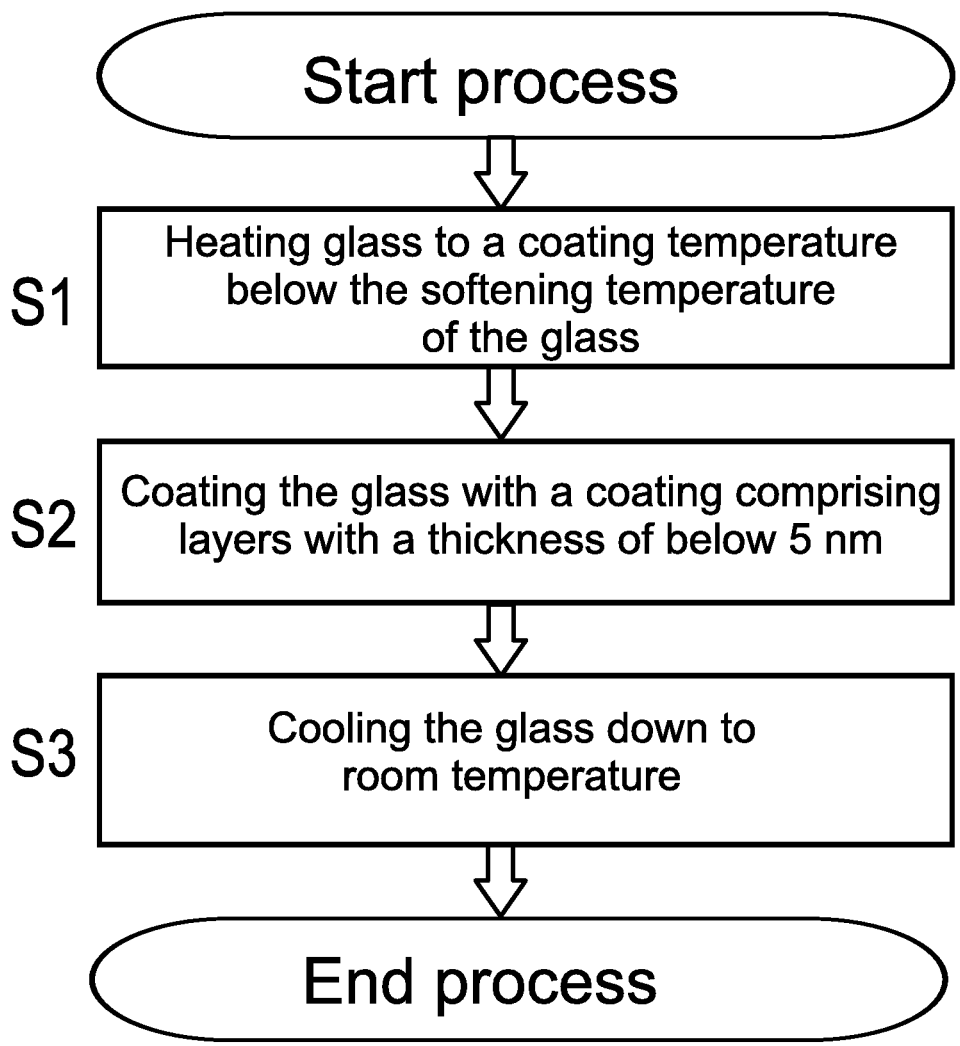

FIG. 2 is a flow chart presentation of a method according to one embodiment of the present invention.

For reasons of simplicity, item numbers will be maintained in the following exemplary embodiments in the case of repeating components.

FIGS. 1a to 1d represent a series of figures illustrating how coating a glass substrate 1 with a method according to one embodiment of the present invention increases the radius of curvature at the tip 7 of a small scratch 2 at the surface of the glass substrate 1, and decreases the depth (and the length) of the scratch 2. The left side figure in each of the FIGS. 1a to 1d represents a cross-section of a surface scratch 2. The figure on the right side in each of the FIGS. 1a to 1d illustrates a top view (e.g. the length and the width) of the same scratch 2 extending along the surface of the glass substrate 1. As seen from the left side figures the method according to one embodiment of the present invention may also increase the radius of curvature at the bottom tip 3 of the scratch 2.

Figure 1D:
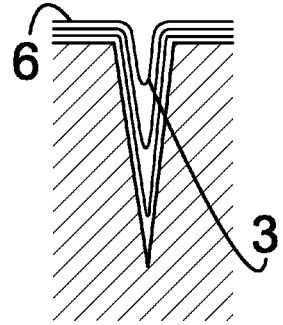
Figure 1D:
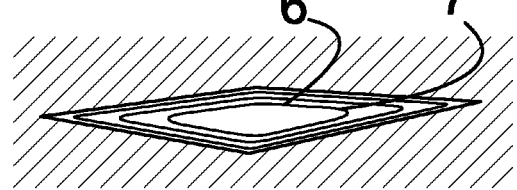

FIG. 1a presents the situation at the beginning of the coating process and FIG. 1d at the end of the coating process. The flow chart of FIG. 2 presents the main steps of the coating process of one embodiment of the present invention. In step S1, glass (a glass substrate 1) comprising small surface scratches 2 is heated to a temperature below the softening temperature of the glass. In case an ALD process is used to perform the coating, a temperature of 100-400° C. for oxide or nitride deposition may commonly be used. In step S2 the glass is coated with thin layers of, e.g. oxide or nitride material. A layer 4, 5, 6 deposited on the glass substrate 1 forms chemical bonds with the underlying glass substrate 1 or with an underlying previous layer. Each ALD-cycle in an ALD process produces one layer 4, 5, 6 of material. Depending on the particular ALD process, the thickness of one layer 4, 5, 6 may range from below one Angstrom to a few nanometers.

In the series of FIGS. 1a to 1d three layers 4, 5, 6 are deposited on the glass substrate 1 to increase the radius of curvature at the tip 7 of the small scratch 2 at the surface of the glass substrate 1, and to decrease the depth (and the length) of the scratch 2. The layers 4, 5, 6 in the illustrated example are of the same material but individual layers may also differ in composition. In the illustrated example the coating consists of the individual layers 4, 5, 6. The glass 1 is cooled down to room temperature in step S3, after the coating process.

EXAMPLE

Coating of Planar Glass with Aluminum Oxide

To fabricate glass products according to one embodiment of the present invention, with a method according to one embodiment of the present invention, 50 pcs of borosilicate glass substrates 1 (microscope glasses) were placed in a reaction chamber of a Beneq TFS500 atomic layer deposition (ALD) reactor. The dimensions of the glass substrates 1 were 25.4 mm×76.2 mm×1.2 mm. The glass substrates 1 were coated with aluminium oxide by alternately exposing the substrates to gaseous trimethylaluminium (TMA) and water precursors. An essentially inert carrier gas was utilized to transport the precursor vapours into the reaction chamber from their respective sources. The pulse (exposure) times for TMA and water were 1.2 s and 0.8 s, respectively. After each precursor pulse a purging period was used to purge the reaction space from this precursor with the carrier gas, for a following precursor pulse (exposure). These pulse times and the purging periods were sufficiently long to enable essentially uniform and essentially conformal film growth through self-limiting surface reactions. Temperature of the reaction chamber of the ALD reactor was about 200° C., i.e. significantly below the glass transition (softening) temperature for the microscope glasses.

The total thickness of the grown aluminium oxide coating was about 20 nm, which was obtained by 180 growth cycles (or ALD cycles) in the prevailing process conditions. Thickness variation of the coating was measured to be below 3% on one glass substrate 1. The ALD-process used in the example produced, in each ALD cycle, a layer 4, 5, 6 with a thickness of about 1.1 Ångströms. The final coating with a total thickness of 20 nm therefore comprised 180 of these thin layers 4, 5, 6.

The flexural strength of the coated glasses was measured by four-point bending. The flexural strength of the uncoated substrate glasses was also measured by the same method. Measurement results for the uncoated and for the coated substrate glasses are presented underneath in table 1 and in table 2, respectively.

TABLE 1

| | | |
|---|---|---|
| Mean value of flexural strength (N/mm$^2$): | | 167.40 |
| Median value of flexural strength (N/mm$^2$): | | 162.24 |
| Standard deviation of flexural strength (N/mm$^2$): | | 46.77 |
| Weibull modulus (Max. likelihood): | | 4.24 |
| Weibull modulus (corrected): | | 3.63 |
| Max. likelihood $\sigma_0$ (modulus of rupture) (N/mm$^2$): | | 184.50 |
| Characteristic strength (for 1 cm$^3$) (N/mm$^2$): | | 81.06 |
| $\sigma_0$ is with (90%) prob. in range (N/mm$^2$): | 158.61 | 215.71 |
| Weibull mod. is with (90%) prob. In range: | 2.35 | 5.73 |

TABLE 2

| | | |
|---|---|---|
| Mean value of flexural strength (N/mm$^2$): | | 180.89 |
| Median value of flexural strength (N/mm$^2$): | | 170.21 |
| Standard deviation of flexural strength (N/mm$^2$): | | 31.26 |
| Weibull modulus (Max. likelihood): | | 6.18 |
| Weibull modulus (corrected): | | 5.30 |
| Max. likelihood $\sigma_0$ (modulus of rupture) (N/mm$^2$): | | 193.91 |
| Characteristic strength (for 1 cm$^3$) (N/mm$^2$): | | 103.16 |
| $\sigma_0$ is with (90%) prob. in range (N/mm$^2$): | 174.81 | 215.85 |
| Weibull mod. is with (90%) prob. In range: | 3.42 | 8.36 |

The measurement data presented above indicates an increase in the flexural strength for the coated glass substrates 1. This surprising result may also be obtained with other coating materials, in addition to the aluminum oxide coating used in the example above. The other coating materials may comprise e.g. zirconium oxide, silicon oxide, zinc oxide or titanium oxide. The material may also comprise or consist of e.g. nitrides, such as boron-, silicon- or aluminum nitride.

As is clear for a person skilled in the art, the invention is not limited to the examples described above but the embodiments can freely vary within the scope of the claims.

The invention claimed is:

1. A method for increasing the durability of glass by a coating, wherein the method comprises the step of coating the glass by alternately repeating essentially self-limiting surface reactions by atomic layer deposition with the coating comprising thin layers having a thickness of below 5 nanometers, the coating being coated essentially conformally on scratches on a glass surface, the scratches having a width at a level of the glass surface of below 300 nanometers, wherein the coating increases a radius of curvature at a tip of a surface scratch and, the coating comprises a compound of at least one element to increase the flexural strength of the glass.

2. The method of claim 1, further comprising coating the glass by alternately exposing the glass to at least two precursors, one precursor at a time, to form the coating by alternately repeating surface reactions between the surface of the glass substrate and a precursor.

3. The method of claim 1, further comprising coating the glass at a temperature below the softening temperature of the glass.

4. The method of claim 1, further comprising coating the glass with a coating having a total thickness of below 1000 nanometers.

5. The method of claim 1, further comprising coating the glass with a coating having a total thickness of below 100 nanometers.

6. The method of claim 1, further comprising coating the glass with a coating comprising oxide of at least one element.

7. The method of claim 1, further comprising coating the glass with a coating comprising oxide of an element selected from the group of aluminium, zirconium, zinc, silicon and titanium.

8. The method of claim 1, further comprising coating the glass with a coating comprising nitride of at least one element.

9. The method of claim 1, further comprising coating the glass with a coating comprising nitride of an element selected from the group of boron, silicon and aluminium.

10. The method of claim 1, further comprising coating glass having a thickness of below 3 millimeters.

* * * * *